US006703994B2

(12) United States Patent
Edwards

(10) Patent No.: US 6,703,994 B2
(45) Date of Patent: Mar. 9, 2004

(54) ACTIVE MATRIX ARRAY DEVICES

(75) Inventor: Martin J. Edwards, Crawley (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 169 days.

(21) Appl. No.: 09/861,941

(22) Filed: May 21, 2001

(65) Prior Publication Data

US 2001/0050728 A1 Dec. 13, 2001

(30) Foreign Application Priority Data

Jun. 10, 2000 (GB) .............................................. 0014074

(51) Int. Cl.$^7$ ................................................ G09G 3/36
(52) U.S. Cl. ........................................ 345/87; 345/92
(58) Field of Search ............................. 345/87, 88, 92, 345/94, 98, 100; 349/41, 47

(56) References Cited

U.S. PATENT DOCUMENTS

| | | | | | |
|---|---|---|---|---|---|
| 4,931,787 | A | * | 6/1990 | Shannon ....................... | 345/93 |
| 5,021,774 | A | * | 6/1991 | Ohwada et al. ............... | 345/90 |
| 5,130,829 | A | * | 7/1992 | Shannon ..................... | 349/111 |
| 5,170,158 | A | * | 12/1992 | Shinya ......................... | 345/98 |
| 5,325,442 | A | | 6/1994 | Knapp ........................... | 382/4 |
| 5,485,177 | A | * | 1/1996 | Shannon et al. ............. | 345/182 |
| 6,246,460 | B1 | * | 6/2001 | Young ......................... | 349/151 |
| 6,411,272 | B1 | * | 6/2002 | Edwards ....................... | 345/87 |
| 6,424,328 | B1 | * | 7/2002 | Ino et al. ...................... | 345/87 |
| 6,448,718 | B1 | * | 9/2002 | Battersby ................. | 315/169.3 |
| 6,452,580 | B1 | * | 9/2002 | Edwards et al. ............ | 345/100 |

FOREIGN PATENT DOCUMENTS

| | | | | |
|---|---|---|---|---|
| EP | 0569090 | 11/1993 | ......... | H01L/27/146 |
| WO | WO9927653 | 6/1999 | ............ | H03M/1/76 |

* cited by examiner

*Primary Examiner*—Richard Hjerpe
*Assistant Examiner*—Ronald Laneau

(57) ABSTRACT

An active matrix array device, such as an AMLCD, has an array of matrix elements (10) addressed via sets of address conductors (14, 16). An address circuit (35) connected to one set (16) includes a multiplexing circuit (31) integrated on the same substrate (25) as the matrix elements and the address conductors of the one set are organised in groups with each conductor in a group being associated with a respective and different one of a plurality of signal bus lines (33) in the multiplexer circuit. Each signal bus line (33) is connected to a respective signal processing circuit (42), e.g. a DAC in the case of an AMLCD, also integrated on the substrate as respective circuit blocks. To avoid problems in use, for example caused by variations in the performance of these signal processing circuits, the arrangement of couplings with the bus lines of the address conductors in adjacent groups is mirrored about the boundary between the groups.

14 Claims, 4 Drawing Sheets

ACTIVE MATRIX ARRAY DEVICES

The present invention relates to an active matrix array device comprising an array of individually addressable matrix elements, first and second sets of crossing address conductors connected to the matrix elements, the array of matrix elements and the sets of address conductors being carried on a substrate, and an addressing circuit connected to the sets address conductors for addressing the matrix elements and comprising a multiplexing circuit integrated on the substrate which is connected to address conductors of the first set and has a plurality, n, of signal bus lines, the address conductors of the first set being arranged in a series of groups with each group comprising n successive address conductors and the multiplexing circuit being arranged to couple sequentially each group of address conductors to the signal bus lines with each address conductor in a group being associated with and coupled to a respective one of the bus lines, the addressing circuit further including a respective signal processing circuit connected to each bus line.

The matrix array device may, for example, be an active matrix liquid crystal display device (AMLCD). Such a device typically comprises an array of liquid crystal display elements each of which is connected to the output of a respective TFT (thin film transistor) to which gating (selection) and data (video information) signals are supplied by respective row and column conductors. The addressing circuit consists of a row drive circuit connected to the row conductors for applying a gating signal to each row conductor in sequence to turn on the TFTs of each row of display elements in turn in respective row address periods and a column drive circuit connected to the set of column conductors for applying data signals to the column conductors in synchronism with scanning of the row conductors whereby the display elements of a selected row are charged via their respective TFTs to a level dependent on the value of the data signal existing on their associated column conductors to produce a required display effect. The TFTs usually comprise either amorphous silicon (a-Si) TFTs or polysilicon TFTs.

Beneficially, parts of the row and/or column drive circuits can be integrated on the substrate peripherally of the display element array using the same large area electronics technology as that employed for the active matrix circuitry of the array. For such purposes, the column drive circuit is customarily provided in the form of a simple multiplexing circuit, whose operation is based on a multiplexing technique in which the video information (data) is sequentially transferred via multiplexing switches from a plurality of video input bus lines, to which video information is applied simultaneously, to corresponding groups or blocks of column conductors in the display with each column conductor in a group being connected via a multiplexer switch to a different video input bus line. When using polysilicon TFT technology, this circuit is usually an analogue multiplexing type comprising groups of multiplexing switches, e.g. TFTs or CMOS gates, and a control circuit (normally comprising a shift register) which controls the operation of the multiplexer switches. Groups of video samples, constituting the data, taken from an input video signal are applied to the video bus lines and the data is then transferred to the relevant groups of column conductors in the display array during a video line period, which corresponds to a row address period.

When using digital video information, for example from a PC or other source, such information needs to be converted into analogue voltage levels usable by the display elements by DACs (Digital to Analogue Converter circuits). If such signal processing circuits were also integrated on the substrate, with their outputs connected to respective ones of the bus lines, then this further integration of additional components of the address circuitry would further simplify manufacture, thereby reducing cost, and would lead to a more compact arrangement with the number of external connections required being fewer.

However, experience has shown that the integration addressing circuitry, and particularly the integration of such processing circuits, can lead to display problems in the form of highly noticeable non-uniformities in the display output produced.

It is one object of the present invention to provide an active matrix array device with improvement in this respect.

According to the present invention, there is provided an active matrix array device of the kind described in the opening paragraph which is characterised in that the order in which the address conductors are associated with the signal bus lines in adjacent groups is mirrored. Thus, for example, if the first and nth address conductor in one group are coupled (via their respective multiplexing switches) to the first and nth signal bus lines respectively, then the first and nth address conductor in the adjacent group(s) are coupled to the nth and first signal bus lines respectively.

The mirroring of the physical arrangement of the couplings between the address conductors and the signal bus lines in adjacent groups means that the last address conductor in one group and the first, and physically adjacent, address conductor in the next group share the same signal bus line, and consequently the same signal processing circuit. This is beneficial to avoiding problems caused by any differences in the characteristics of the signal bus lines, for example due to their physical arrangement and the possibility of unwanted coupling of signals onto one line through parasitic capacitive coupling effects with adjacent lines and the like which then affect the data signals supplied by that signal bus line to its associated address conductors. More especially, it is important also to overcoming the aforementioned problems with display non-uniformity, particularly when the signal processing circuits associated with the bus lines are also integrated on the same substrate and fabricated from thin film circuit elements. It has been recognised that such display problems can result due to deficiencies in the operational characteristics of circuit elements when using thin film circuit components, such as TFTs and capacitors, for such purposes. In large area, thin film technology devices, the operational characteristics of individual thin film components such as TFTs will normally be similar where the components are formed physically close together but can vary significantly in the case of components formed further apart due, for example, to slight variations over the area of the device in the thicknesses and characteristics of individual deposited layers. With the n signal processing circuits associated with the n signal bus lines arranged physically juxtaposed in a line on the substrate for example, the operational behaviour of the first and last processing circuits may then differ significantly. If, therefore, successive signal processing circuits, for example, are simply connected in corresponding manner to the signal bus lines and the address conductors in each of the groups are connected to the bus lines in the same, repetitive and symmetrically identical, fashion, then it will be appreciated that the adjacent, last and first, address conductors in two adjacent groups will be associated respectively with the last and first signal processing circuits. Consequently any differences in the performance of these two processing circuits in view of the fact that they are widely separated will be highly noticeable as the matrix elements they serve are immediately adjacent one another. In the case for example of the device comprising an active matrix display device, such as in AMLCD, and the signal processing circuits comprising DAC circuits arranged juxtaposed, then variation in the analogue output voltages provided by the first and last converters to their respective bus lines, (associated with the first and last column conductors in one group,) will likely be the greatest due to them being the furthest apart. Their respective generated output voltage signals will appear on adjacent column conductors at regular intervals, corresponding to the groups over the array, and differences in the voltages applied to each adjacent pair will produce display non-uniformities in the nature of periodic, highly visible, steps in brightness across the display. Mirroring the coupling arrangement between the address conductors and signal bus lines in adjacent groups in accordance with the invention avoids this possibility of discrepancies occurring with respect to the data signals associated with the adjacent address conductors.

Preferably, for simplicity, successive address conductors in a group are associated with corresponding, successive, ones of the signal bus lines and successive address conductors in an adjacent group are associated with the signal bus lines in reverse order. Thus, in one group, the mth address conductor is associated with the mth signal bus line, where $1 \leq m \leq n$, and in the next, adjacent, group the mth address conductor is associated with the $(1+(n-m))^{th}$ signal bus line. Effects due to the resistive nature of the address conductors will also be less apparent with this arrangement as the overall lengths of successive adjacent address conductors, taking into account their extensions connecting with the signal bus lines, will progressively vary (increase or decrease) by only small amounts. However, other arrangements are, of course, possible while still satisfying the mirrored requirement for the couplings between address conductor and signal bus lines in adjacent groups.

When input data signals are supplied to the signal processing circuits, as in an active matrix display device to which digital image information signals applied, then the order in which these signals are provided will need to be appropriately modified to take account of the nature of the coupling arrangement between the address conductors and signal bus lines rather than being supplied in the usual way as a data stream. However, this can easily be accomplished by means of an input distribution circuit, comprising, for example, a signal multiplexer and latch circuit, which operates to direct each data signal to the appropriate processing circuit (DAC) which in turn supplies it to the relevant signal bus line.

Besides AMLCDs the invention can be used in other active matrix display devices such as AMLEDs.

The invention can be applied to similar advantage in other kinds of active matrix array devices as well as active matrix display devices. For example, it is envisaged that the invention can be used in active matrix sensing array devices such as image sensing devices as described in EP-A-0569090 and fingerprint sensing devices as described in U.S. Pat. No. 5,325,442 and the like. These devices similarly comprise an array of matrix elements addressed via sets of row and column address conductors. The elements in such devices comprise light sensing or capacitive sensing elements and in operation each element provides an output signal, for example, in the form of an electrical charge, along an associated address conductor of one set to which a sense amplifier is connected. The conductors of the one set are preferably connected via a multiplexing circuit to a set of sense amplifiers. In accordance with the present invention, therefore, the multiplexing circuit and preferably also the sense amplifier circuits, constituting the aforementioned signal processing circuits, can be integrated on the same substrate as the sensing element array similarly using thin film technology and with the address conductors in adjacent groups being associated with signal bus lines in the multiplexing circuit in the above described manner so as to reduce the effect of variations in voltages etc in the individual sense amplifier circuits caused by differences in the operational characteristics of thin film elements in these circuits, particularly when integrated and spaced apart on the substrate.

Embodiments of active matrix array devices in accordance with the invention will now be described, by way of example, with reference to the accompanying drawings, in which.

It will be appreciated that the figures are merely schematic and have not been drawn to scale. The same reference numbers are used throughout the figures to indicate the same or similar parts.

Figure 1:
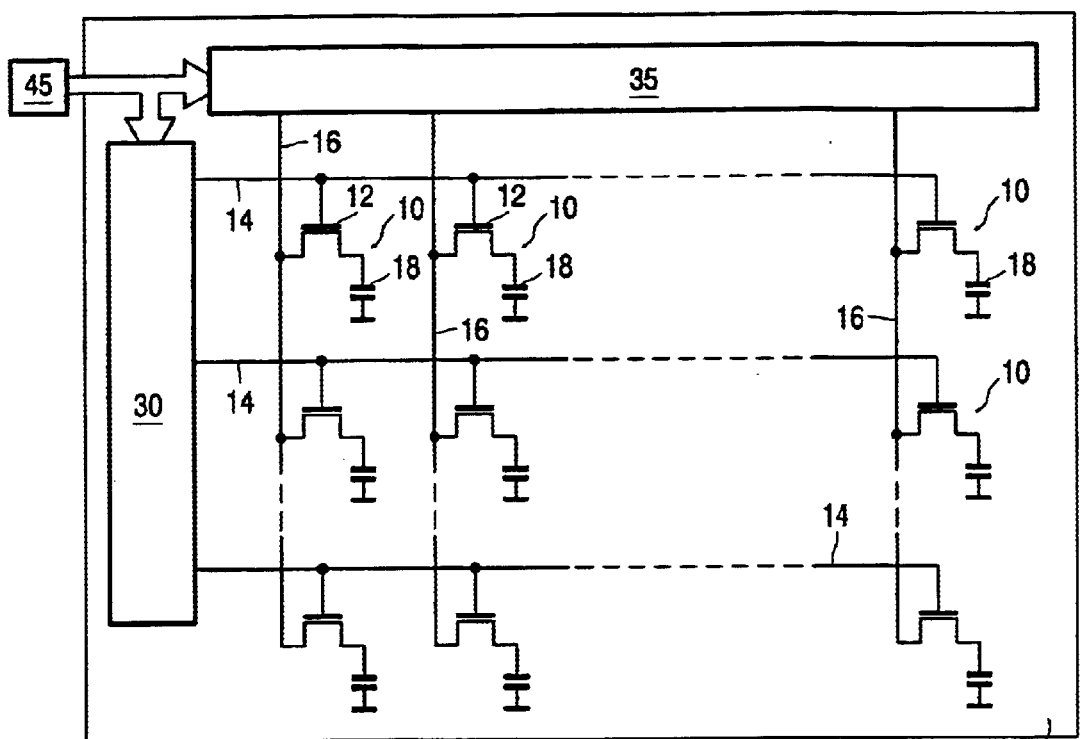
FIG. 1 is a simplified schematic circuit diagram of an embodiment of AMLCD device according to the invention.

Referring to FIG. 1, the active matrix array device comprises an AMLCD having a row and column array of individually operable liquid crystal display elements 10. The display elements each have an associated TFT 12 acting as a switching device and are addressed via sets of row and column address conductors 14 and 16 by peripheral addressing circuitry comprising a row drive circuit 30 and a column drive circuit 35 connected respectively to the sets of row and column conductors. Only a few typical display elements are shown for simplicity but in practice there would normally be at least several hundred rows and columns of such elements. One terminal, for example the drain, of a TFT 12 is connected to a respective display element electrode 18 situated adjacent the intersection of respective row and column address conductors, while the gates of all the TFTs associated with a respective row of display elements 10 are connected to the same row address conductor 14 and the other terminals, the sources, of all the TFTs associated with a respective column of display elements are connected to the same column address conductor 16. The sets of row and column address conductors 14, 16, the TFTs 12, and the picture element electrodes 18 are all carried on the same insulating substrate 25, for example of glass, and fabricated in conventional manner using known thin film technology involving the deposition and photolithographic patterning of various conductive, insulating and semiconductive layers. A second glass substrate, (not shown) carrying a continuous transparent electrode common to all display elements in the array is arranged spaced from the substrate 25 and the two substrates are sealed together around the periphery of the display element array and separated by spacers to define an enclosed space in which liquid crystal material is contained. Each display element electrode 18 together with an overlying portion of the common electrode and the liquid crystal material therebetween defines a light-modulating capacitive display element.

Both the general structure of the display element array and its operation follow conventional practice, for example as described in U.S. Pat. No. 5,130,829, to which reference is invited. Briefly, scanning (gating) signals are applied to each row address conductor 14 in turn by the row driver circuit 30 and data signals are applied to the column conductors 16, in synchronisation with the gating signals, by the column drive circuit 35. Upon each row conductor being supplied with a gating signal, the TFTs 12 connected to that row conductor are turned on causing the respective display elements to be charged according to the level of the data signal then existing on their associated column conductors. Upon termination of the gating signal at the end of the respective row address period, corresponding for example to the line period of an applied video signal, the associated TFTs are turned off for the remainder of the field period in order to isolate electrically the display elements and ensure the applied charge is stored on the LC capacitance to maintain their display outputs until they are addressed again in a subsequent field period.

The row and column drive circuits 30 and 35 here are both integrated on the substrate 25 with their circuitry being formed simultaneously with the fabrication active matrix array using the same thin film technology and similarly comprising TFTs, preferably polysilicon TFTs, conductor lines, capacitors, etc. The row drive circuit 30 is of convention form, comprising for example a simple digital shift register circuit whose operation is controlled by timing signals provided by an external timing and control circuitry 45 to which a digital video signal is supplied from a suitable source.

Digital video information (data) signals are supplied by the timing and control circuitry to the column drive circuit 35 which operates to apply to the set of conductors 16 analogue voltage signals derived from this data in parallel for each row of display elements in turn so as to produce the desired display effects from the displays element in each row according to the supplied data.

As is common in AMLCDs having partly integrated column drive circuitry, particularly devices employing polysilicon TFTs, the column drive circuit 35 is of the analogue multiplexing kind and has an integrated multiplexing circuit providing a respective output for each column conductor 16. The column driver circuit in this embodiment will be described in detail later. However, in order for the benefits of this circuit to be understood a known form of column drive circuit will first be described.

Figure 2:
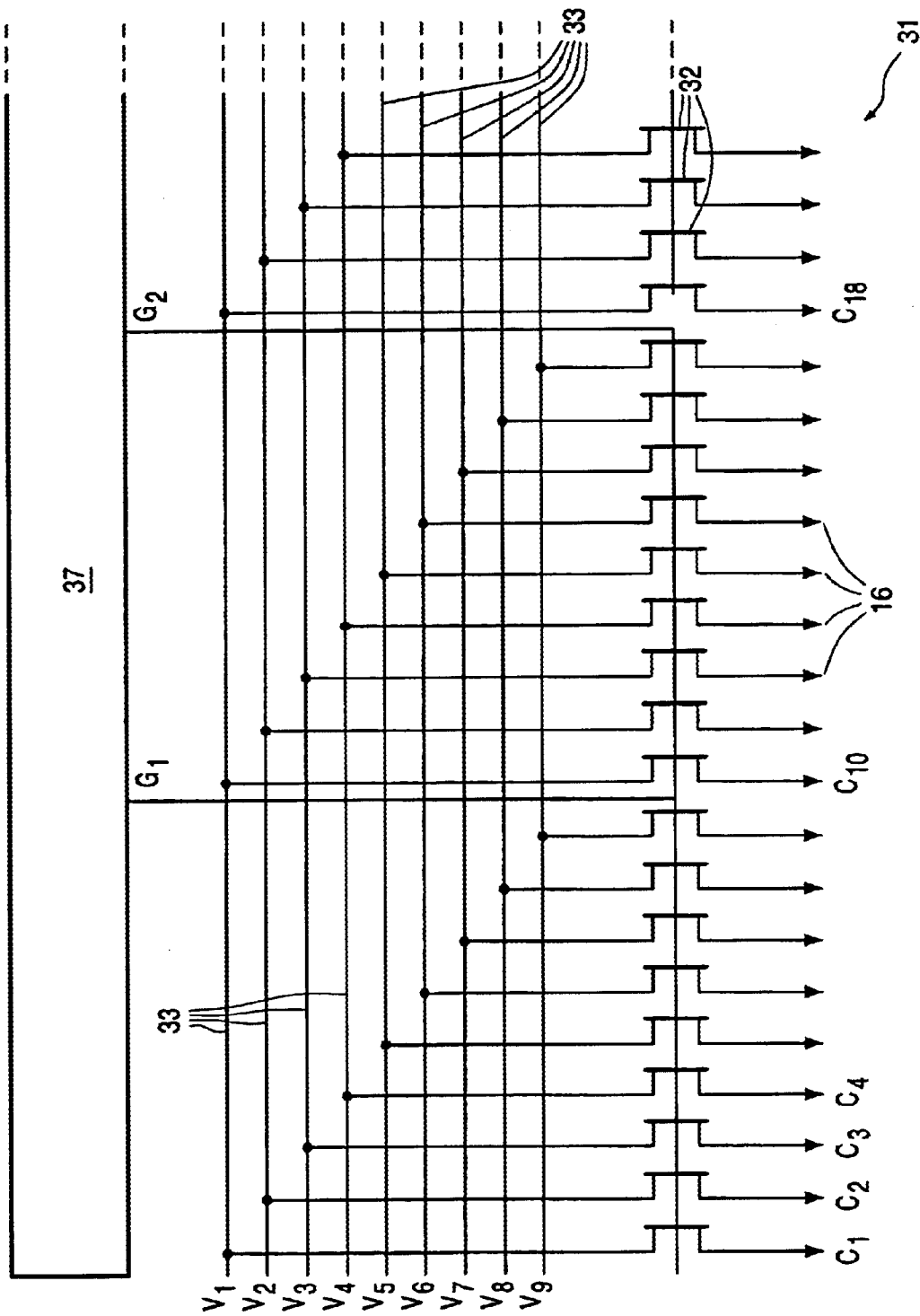
FIG. 2 illustrates schematically the circuit of a known example of multiplexer circuit used in AMLCD.

An example of a simple known form of multiplexing circuit, 31, is illustrated, in part, in FIG. 2. The general operation of such a circuit is based on a multiplexing technique in which analogue video information is sequentially transferred from a plurality of video input signal bus lines supplied in parallel with video data to corresponding groups of column address conductors in the display device. The video information is transferred via multiplexing switches, 32, which may consist of NMOS TFTs, PMOS TFTs or CMOS transmission gates. The switches, which each constitute an output of the circuit associated with a respective column conductor, are operated in groups and when a group of switches is turned on the corresponding columns are charged according to the data signal voltage levels then existing on the respective associated video bus lines. When the switches turn off the voltages on the column conductors are stored on the capacitance of the column conductors and any additional storage capacitors which may be connected in parallel with them. During a respective video line (row address) period each group of multiplexing switches is turned on in sequence until all of the columns of display elements have been charged with the appropriate video information.

In the example of FIG. 2, there are nine parallel video input signal bus lines 33, V1 to V9, arranged physically parallel and in the order corresponding to their number to which input video signals are applied in parallel, and the multiplexing switches, 32, are arranged in groups of nine with their outputs connected to respective and consecutive, ones of the column address conductors 16, C1–9, C10–18, etc. A control circuit 37, comprising a shift register, sequentially selects each of the groups of multiplexing switches by way of the control signals G1, G2, etc so that at the end of the row address period all the columns in the array have been charged. When G1 goes high the first nine multiplexer switches 32 close and the first nine columns C1 to C9 are charged to the voltage level on the video lines V1–V9 respectively. G1 then goes low, opening the nine associated multiplexer switches to isolate the columns C1 to C9 from the video lines. The voltages on the columns are then stored on the column capacitances. Next, the control signal G2 goes high, closing the next group of switches 32 and the second group of nine columns, C10 to C18, is charged to the voltages then existing on the respective video lines 33. The operation of the multiplexing circuit continues in this way with each group of columns being charged appropriately in succession until all the column conductors in the array have been charged in a respective row address period. Subsequent rows of display elements are addressed in similar manner in respective row address periods.

It is usual for the analogue video data signals required for the video bus lines 33 to be supplied from external circuitry, which in the case of digital video signals being used requires digital to analogue converter, DAC, circuits. However, in the device embodiment of FIG. 1 the DAC circuits are also integrated, together with the multiplexing circuit 31, on the array substrate as part of the column drive circuit 35 and comprise thin film circuit elements, i.e. TFTs, conductor lines, capacitors etc, fabricated simultaneously with the active matrix array. An example of a DAC circuit suitable for this purpose is described in WO99/27653 (PHB 34210) although other known DAC converter circuits, such as switched capacitor type circuits, may be suitable as well. As is usual with such circuits, each DAC circuit includes an input latch circuit. The digital to analogue converter circuits are arranged physically on the substrate as a set or series of respective blocks occupying respective and substantially discrete areas of the substrate, the number of such blocks corresponding to the number of video bus lines 33, (and column conductors in each group).

Figure 3:
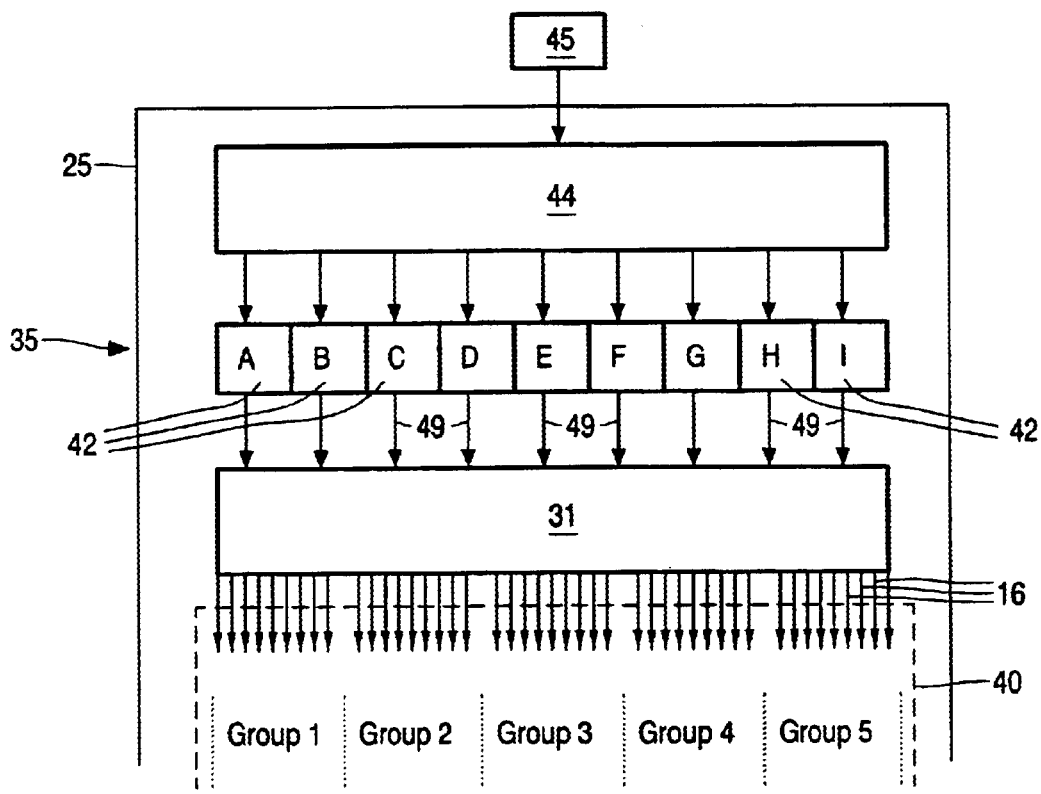
FIG. 3 illustrates diagrammatically a possible lay-out of components of the drive circuit in the AMLCD device of FIG. 1.

FIG. 3 illustrates schematically the column drive circuit 35. The circuit basically comprises three parts. The stream of input digital video information (data) signals from the source 45 is routed to the inputs of the DACs, here referenced 42, by an input distribution, or multiplexer, circuit 44 and the output data signals from the DACs 42 supplied to the multiplexer circuit 31 which in turn operates to transfer the output data signals to the appropriate column address conductors 16 for the display elements in the display element array, here denoted generally at 40. The multiplexing circuit 31, including the video signal bus lines, extends parallel to, and alongside, one side of the array with the individual outputs of the circuit 31 being connected to respective ones of the column address conductors 16. The column address conductors in the simple example shown are organised in five groups of nine, although the number of groups and the number of address conductors in each group can be varied. (In a typical display panel there may be several hundred address conductors). Correspondingly, nine video signal bus lines are provided in the multiplexer circuit 31 each of which is associated with, and supplied with data signals by, a respective DAC 42, the nine converters here being labelled A to I As shown, these blocks are arranged juxtaposed in a row generally parallel with the multiplexing circuit 31 and its video bus lines. Power supply, timing signals and video information signals are supplied to the blocks from the external timing and control circuit 45 which also supplies power and timing signals to the multiplexing circuit 31. The blocks are ordered successively corresponding to the order of the signal bus lines and their respective outputs 49, along which the video signals V1 to V9 respectively are supplied, are connected to the appropriate bus lines 33 in the multiplexing circuit 31 at regularly—spaced locations, corresponding to the block spacings, rather than to the ends of these lines. While the individual circuit blocks of the DACs 42 generally occupy discrete regions of the substrate surface certain components such as clock and power lines will be shared between blocks.

The distribution circuit 44 may comprise, for example, a data bus, latches and circuits for controlling the operation of the latches. The stream of sampled video data signals is distributed appropriately and presented at the inputs of the DACs 42. In the examples to be described, the video data is presented at the nine converter circuit inputs simultaneously, requiring the use of two latching circuits for each converter. However, alternative arrangements in which the data is not presented simultaneously are also possible.

The distribution circuit 44 may be fully or only partly integrated on the substrate 25, again using thin film TFT technology. However, this circuit could be provided entirely externally, i.e off the substrate.

The data information samples supplied to the DACs 42 are converted therein to analogue data voltage signals usable by the display elements which are transferred from their outputs and distributed appropriately to the column conductors via the circuit 31.

The nine columns 16 of the display array associated with each group are here addressed simultaneously, although schemes in which the column conductors is a group are not addressed simultaneously are also possible.

It will be appreciated that by appropriate design of the input and output distribution circuits 44 and 31 of the column drive circuit 35 it is possible to use any one of the DACs 42 to provide the data signal for any single column conductor within a group, each column conductor still being associated with a respective video signal bus line and a respective DAC 42. It is also possible to vary from one group to the next which column conductor in the group is associated with a particular bus line DAC 42. The routing of the video data by the circuits 44 and 31 at the input and output of the column drive circuit 35 is coordinated so that each sample of the video information is transferred to the correct column conductor. This ability of the column drive circuit 35 is utilised to avoid unwanted display artefacts which could otherwise occur, particularly due to the fact that the DACs circuits 42 are integrated to the substrate 25.

As previously explained, then because of the nature of thin film circuits, possible variations in operation can occur from one DAC 42 output to another and this can lead to display non-uniformities, especially at the junctions between successive groups where the last column conductor of one group and the adjacent, first, column conductor of the next group use DACs which are widely separated. This would be the case if successive column conductors in a group were associated respectively with successive ones of the set of video signal bus lines (as in the FIG. 2 example) which in turn were associated with successive ones of the series of converter circuits and each group is arranged in identical manner. With such an arrangement, then, referring to FIG. 3, the first column conductor in each group would be associated with the DAC A, the second column conductor in each group would be associated with the DAC B, etc. As a result of successive ones of the series of DACs supplying successive column conductors in the groups then any slight variations in the operation of different ones of the converter circuits and the consequent voltage variations in their outputs supplied to the column conductors will tend to be greatest between DAC A and the DAC I as these two converter circuits are spaced physically on the substrate 25 the furthest apart. Although the output voltage variations tend to be the most significant with circuit blocks widely separated on the substrate, the variation in voltages produced in blocks physically closer together, and therefore whose thin film circuit elements are much less widely separated, will likely be minimal. Referring to FIG. 2, it will be appreciated that the signals generated by the converter circuits A and I will appear, via the signal bus lines V1 and V9, on immediately adjacent columns of the display, i.e. on the last column conductor of one group and the first column conductor of the next group. Thus, assuming a uniform display field is intended, a difference in voltages applied to these columns will show up as steps in output brightness from the display elements across the display, and repeating with a pitch equal to the number of columns in each group.

Figure 4:
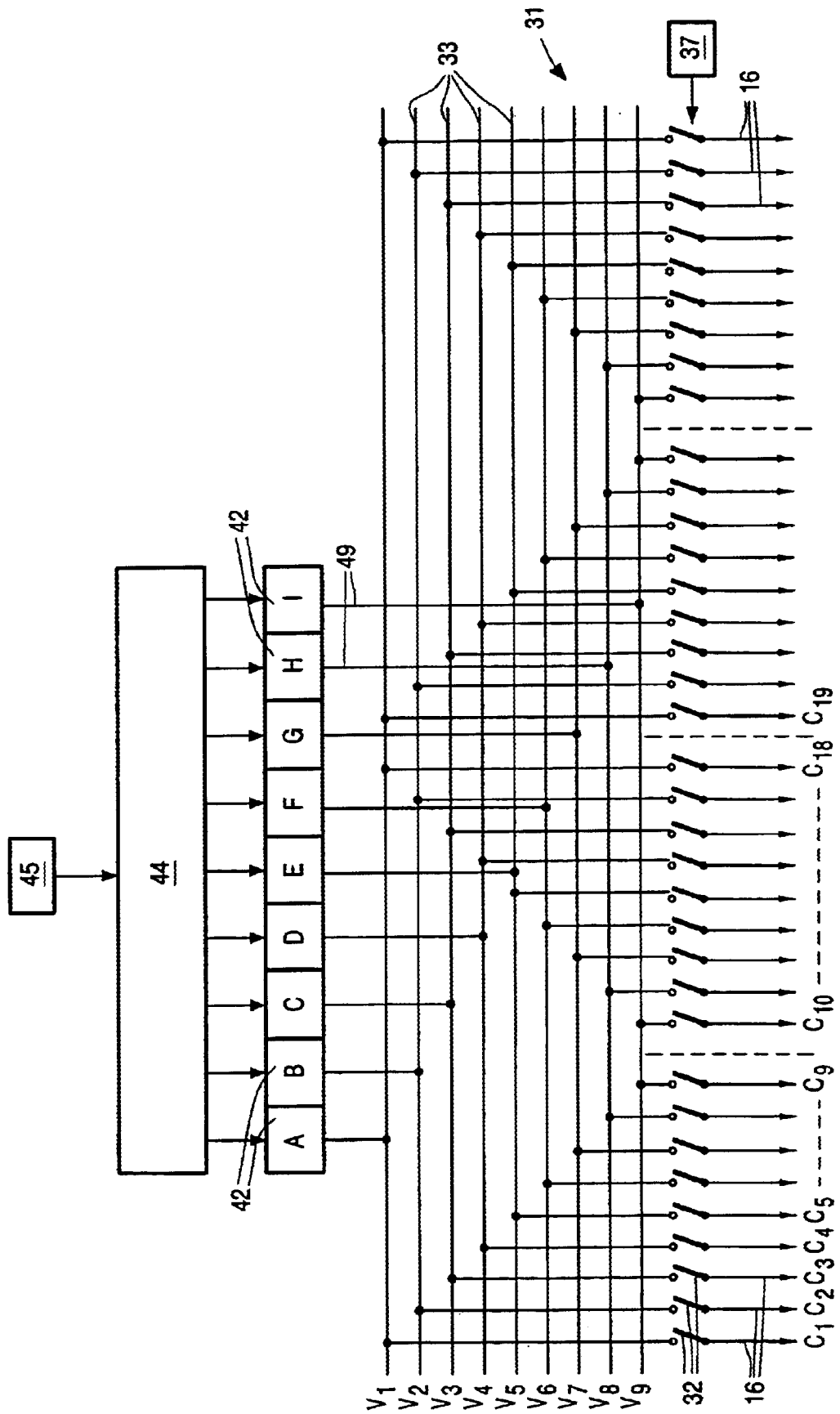
FIGS. 4 and 5 illustrate diagrammatically parts of the drive circuit in the device according to the present invention.

FIG. 4 illustrates schematically the arrangement of the column drive circuit in an embodiment according to the present invention and intended to reduce the visibility of the effects of such output voltage variations. From this figure, it is seen that the nine DAC circuit blocks A to 1 are again arranged in series in a line parallel to the multiplexing circuit 31 with the outputs from the DAC circuits A to 1 being supplied to successive video signal bus lines V1 to V9 respectively as before. The switches 32 are operated, by the circuit 37, in groups of nine sequentially as in the FIG. 2 arrangement. The association between the column conductors 16 in successive groups and the video signal bus lines is, however, different. The boundaries between adjacent groups of column conductors are indicated in FIG. 4 by the broken lines. As can be seen, the nine column conductors 16 of one group, labeled C1 to C9, are associated with respective and different ones of the bus lines V1 to V9 but the nine column conductors of the adjacent, next group, C10 and C18, are associated wit the bus lines in mirror order, with respect to that preceding group, and this arrangement is repeated for all successive groups. Thus, the column conductors C1 to C9 of the first group are coupled, via the multiplexer circuit 31, to the video signal bus lines V1 to V9 respectively, the column conductors C10 to C18 of the next group are coupled to the video signal bus lines V9 to V1 respectively, the column conductors C19 to C27 are coupled to the bus lines V1 to V9 respectively, etc. The manner of association between the column conductors and the bus lines is, therefore, symmetrical about the boundaries between adjacent groups.

In general, where there are n column conductors in a group, then the mth column conductor ($1 \leq m \leq n$) of, say, the odd number groups, is associated with the mth bus line and in the other, even number, groups, the mth column conductor is associated with the (1+(n−m))th bus line.

As will be apparent, therefore, the last column conductor of one group and the immediately adjacent, first, column conductor of the next group, for example column conductors C9 and C10, are both associated with the same video signal bus line, V9, and consequently share the same DAC circuit, I, so that the video data signals supplied to those two column conductors emanate from the same converter circuit 42. Similarly, with regard to the last column conductor of this next group and the first column conductor of the succeeding group, i.e C18 and C19 respectively, these two column conductors share the same video signal bus line V1 and DAC circuit, A.

As a consequence of the mirrored ordering of the couplings between the groups of column conductors and bus lines, problems due to variations in output voltages from widely spaced DAC converter circuits supplying immediately adjacent column conductors at the boundaries between adjacent groups is eliminated.

The maximum amount of voltage difference which can occur for different columns in any one group will be unchanged. However, as any two adjacent column conductors in a group are supplied by adjacent, physically close, converter circuits, any variations in the voltages supplied to those adjacent columns will be minimal and the visible effects hardly noticeable. The mirrored nature of the coupling arrangement is such that differences in voltages on the video bus lines which connect to successive columns is as small as possible, and the possibility of large variations occurring from one column to the next is avoided.

This mirrored coupling arrangement also assists in overcoming problems due to variations in the electrical characteristics of the individual signal bus lines, such as the effects of unwanted coupling of signals from one line to another through parasitic capacitances or the like which could result in the data signals supplied by one bus line containing small errors.

Although preferable, it is not essential that successive individual columns in a group are associated with successive bus lines, and hence converter circuits 42, in the manner shown. For example, column conductors C5 and C3 could, if desired be associated with bus lines V3 and V5 respectively instead. The symmetrical arrangement shown, however, results in the overall length of successive address conductors varying progressively by only small amounts and consequently any unwanted effects due to the resistance of the conductors will be much less noticeable.

In view of the different way in which the groups of column conductors are associated with the bus lines and converter circuits, it becomes necessary to supply the digital video information (data signals) to the DACs in appropriately modified order. More precisely, the required sequence of the digital data signal samples for transfer to the converter circuits A to I will be A,B,C,D,E,F,G,H,I, I,H,G,F,E,D,C,B, A,A,B,C,D,E,etc. Such ordering is accomplished by the input signal multiplexer and latch circuit 44.

Thus the input distribution circuit 44 sends successive samples of the video signal to different DACs 42 depending on whether an odd or an even numbered group is to be addressed by the output multiplexer circuit 31 and when the last DAC 42 is reached, at the end of one group, the sequence in which the samples are supplied is reversed. This can be achieved quite simply by modifying the logic which generates the control signals for the latches in the input distribution circuit 44. For example, if the parallel outputs of a shift register are used to select successive latches then the scanning direction of the register could be reversed in the periods when alternate groups of columns are addressed.

Figure 5:
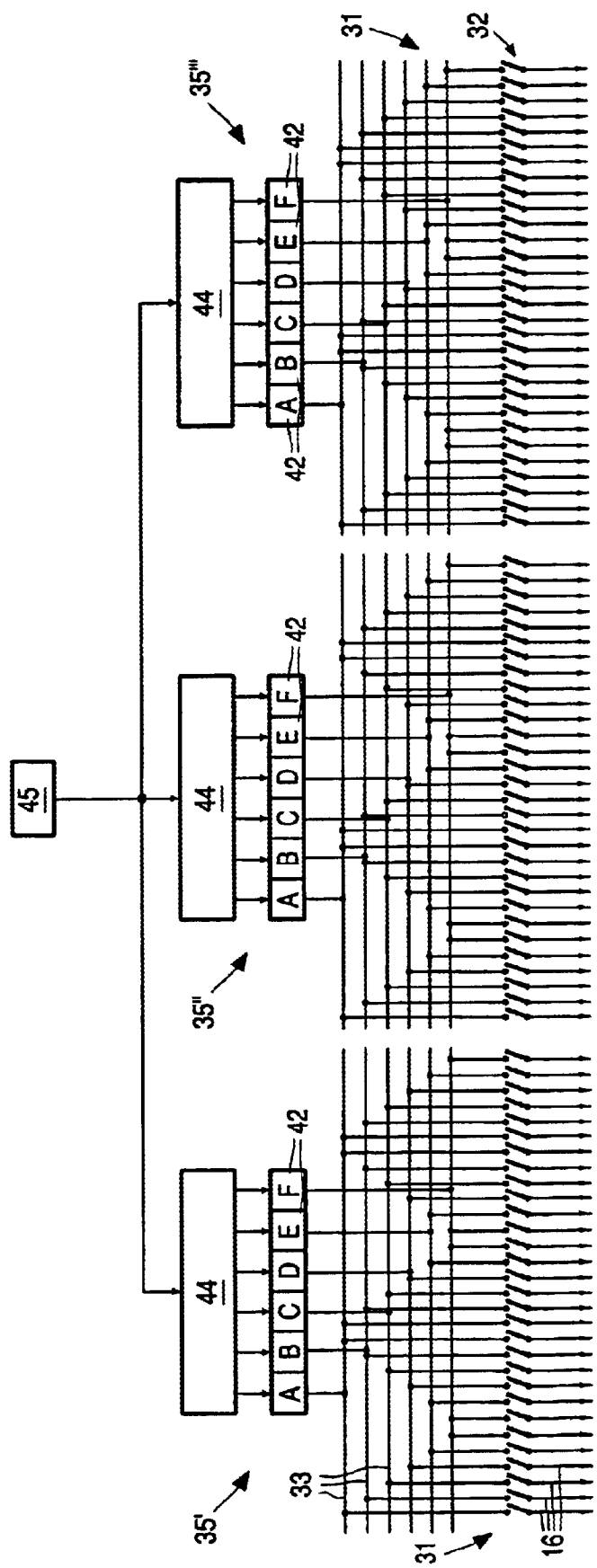

As shown in FIG. 5, the column drive circuit may be divided into several sections, each having a separate column drive (sub-) circuit 35', 35" and 35''' with its own multiplexing circuit 31, distribution circuit 44 and DACs 42. In this example, three sections are illustrated each of which comprises five successive groups of columns with each group comprising six successive column conductors 16, requiring six video signal bus lines and six DAC circuits 42, A to F. The number of groups of columns addressed by each section is selected to ensure that the last column addressed by one section and the first column addressed by the next section are supplied with signals from closely spaced converter circuits. To this end, the converter circuit F of one section is arranged to be physically close to the converter circuit A of the next section Each section therefore has to address an odd number of groups of columns. By using separate column drive sub-circuits in this manner, each with its separate set of video bus lines, faster operation becomes possible. As the length of the individual video bus lines is shorter, corresponding approximately to a third of the total row length, then their RC time constant is smaller and data signals can be switched onto them more quickly. Also, the physical width of these lines can be reduced. The three sections can also be operated simultaneously in parallel, thereby enabling each block to be operated at a lower frequency.

Although the above-described example of display device utilises digital video signals supplied to the column drive circuit 35 and the circuit blocks 42 comprise DAC circuits, each including an input latch circuit, the same technique is applicable to other kinds of column drive circuit which supply the necessary signals for the plurality of video bus lines in the multiplexing circuit. Thus, the column drive circuit may be of a type to which analogue video information is applied instead, in which case each of the circuit blocks 42 can comprise a sample and hold circuit with buffer amplifier, or other known form of analogue video signal processing circuit suitable for the required purpose.

While the DAC blocks have been shown as being arranged parallel to the multiplexing circuit between one side of the display element array and an edge of the substrate 25, the circuits could be located elsewhere on the substrate, for example closer to the region where the externally provided video signal is supplied to the substrate. The blocks 42 could be arranged other than linearly in one or more rows.

In a colour display device, then assuming the pixels in a row are arranged in RGBRGB etc. order, the video signal bus lines V1 to V9 can supply red, green, blue, red, green, blue, etc. colour information, in which case the blocks 42 in the FIG. 4 example would, starting at the left, operate with red, blue, green, green, blue, red, etc colour information respectively.

The active matrix display device may be of a type using display elements other than LC display elements for example, electroluminescent or electro-chromic display elements.

The invention is applicable also to other kinds of active matrix array devices in which it would be desirable to integrate more of the addressing circuitry, such as sensor array devices in which matrix sensing elements comprise, for example, optical sensing elements, as in image sensing array devices, or pressure or capacitive sensing elements, as in touch or fingerprint sensing array devices, and in which the matrix array of sensing elements are similarly addressed via sets of row and column conductors. Typical examples of an image sensing device and fingerprint sensing device are described in EP-A-0569090 and U.S. Pat. No. 5,325,442 respectively. In these types of devices, each row of the matrix elements is selected via an associated address conductor of one set and data from the elements of the selected row, usually in the form of electrical charges, is read out via respective conductors of the other set. The conductors of this other set can be organised in groups and coupled to a multiplexing circuit similar to that of FIG. 4 and with the signal bus lines connected to respective associated sense amplifiers responsive to the element outputs. The sense amplifiers can be integrated, together with the multiplexing circuit, on the same substrate as the array of sense elements, and fabricated, using thin film technology, simultaneously with the sense element array. The above-described manner of coupling the set if address conductors to the signal bus lines and sense amplifiers can then be used to avoid problems caused by variation in the operational characteristics of the sense amplifier circuits which are situated further apart.

In summary, therefore, an active matrix array device, such as an AMLCD, has an array of matrix elements addressed via sets of address conductors. An address circuit connected to one set includes a multiplexing circuit integrated on the same substrate as the matrix elements and the address conductors of the one set are organised in groups with each conductor in a group being associated with a respective and different one of a plurality of signal bus lines 33 in the multiplexer circuit. Each signal bus line 33 is connected to a respective signal processing circuit e.g. a DAC in the case of an AMLCD, also integrated on the substrate as respective circuit blocks. To avoid problems in use caused by variations in the performance of these signal processing circuits, the arrangement of couplings with the bus lines of the address conductors in adjacent groups is mirrored about the boundary between the groups.

From reading the present disclosure, other modifications will be apparent to persons skilled in the art. Such modifications may involve other features which are already known in the field of active matrix array devices and component parts thereof and which may be used instead of or in addition to features already described herein.

What is claimed is:

1. An active matrix array device comprising:
    an array of individually addressable matrix elements;
    first and second sets of crossing address conductors connected to the matrix elements, the array of matrix elements and the sets of address conductors being carried on a substrates; and
    an addressing circuit connected to the sets of address conductors for addressing the matrix elements which addressing circuit comprises a multiplexing circuit integrated on the substrate which is connected to address conductors of the first set and which has a plurality, n, of signal bus lines,
    the address conductors of the first set being arranged in a series of groups with each group comprising n successive address conductors and the multiplexing circuit being arranged to couple sequentially each group of address conductors the signal bus lines with each address conductor in a group being associated with and couple to a respective one of the bus lines,
    the addressing circuit further including a respective signal processing circuit connected to each signal bus line,
    wherein the order in which the address conductors are associated with the signal bus lines in adjacent groups is mirrored.

2. The device of claim 1, wherein successive address conductors in a group are associated with corresponding, successive, ones of the signal bus lines and successive address conductors in an adjacent group are associated with the signal bus lines in reverse order.

3. The device of claim 1 wherein the signal processing circuits are integrated on the substrate and formed in respective circuit blocks comprising thin film circuit elements.

4. The device of claim 3, wherein the multiplexing circuit extends alongside a side of the array of matrix elements and the signal processing circuit block are arranged in at least one row extending alongside the multiplexing circuit.

5. The device of any one of the preceding claims, wherein the addressing circuit comprises a plurality of multiplexing circuits each of which is addressed with respective series of groups of address conductors of the first set.

6. The device of claim 5, wherein the plurality of multiplexing circuits are arranged to be operated simultaneously.

7. The device of claim 1, wherein the matrix elements comprise electro-optic display elements.

8. The device of claim 7, wherein the signal processing circuits comprise digital to analogue converter circuits.

9. The device of claim 7, wherein the signal processing circuits comprise sample and hold circuits.

10. The active matrix array device of claim 2, herein the signal processing circuits are integrated on the substrate and formed in respective circuit blocks comprising thin film circuit elements.

11. The device of claim 10, wherein the multiplexing circuit extends alongside a side of the array of matrix elements and the signal processing circuit blocks are arranged in at least one row extending alongside the multiplexing circuit.

12. The device of claim 1, 2, 3, 4, 10, or 11 wherein the matrix elements comprise sensing elements each of which is responsive to an input to produce an output signal along its associated address conductor of the first set.

13. The device of claim 12, wherein the signal processing circuits comprise sense amplifier circuits.

14. The device of claim 1, wherein in one group of address conductors, an $m^{th}$ address conductor is associated with an $m^{th}$ signal bus line, where $1<=m<=n$, and in a next, adjacent group of address conductors, an $m^{th}$ address conductor is associated with an $(1+(n-m))^{th}$ signal bus line.

* * * * *